Sept. 6, 1966 J. C. STURMAN 3,271,590

INVERTER CIRCUIT

Filed May 14, 1963 2 Sheets-Sheet 1

INVENTOR.
JOHN C. STURMAN
BY G. D. O'Brien
Norman T. Musial
ATTORNEYS

INVENTOR.
JOHN C. STURMAN
BY G. D. O'Brien
Norman T. Musial
ATTORNEYS 3,271,590
Patented Sept. 6, 1966

3,271,590

INVERTER CIRCUIT

John C. Sturman, 4336 Grannis, Fairview Park 26, Ohio

Filed May 14, 1963, Ser. No. 280,472
2 Claims. (Cl. 307—88.5)

The invention described herein may be manufactured and used by or for the Government of the United States of America for governmental purposes without the payments of any royalties thereon or therefor.

The instant invention relates to inverter circuits and, more particularly, to transistorized logic inverter circuits.

Man's exploration of space has dictated a need for instrumentation having fast response, low power consumption, low component densities and low thermal dissipation. This need has become of paramount importance in logic circuitry used to handle data and transmit it back to earth in satellite experiments and space probes. Further, in deep space probes, as the distance from the sun becomes greater, available solar power decreases making it necessary to carry auxiliary power units which are undesirable. Cooling problems for such systems become formidable and necessitate additional equipment which thereby defeats the original objective of small size when miniaturization is achieved. Furthermore, in logic circuits where miniaturization has been achieved, the time constant or response of the circuit is decreased creating problems for on-board guidance computation and control and command systems for ground control.

The use of transistors as the active elements in logic inverter circuits has brought about considerable improvement in their reliability, size, speed of operation, and power dissipation. However, these circuits are conventional logic circuits that have been scaled down to operate at lower supplied voltages and operating currents. Supply voltage for a given circuit is usually decreased to that limit imposed by the couplings.

Accordingly, an object of the logic inverter circuit invention is to provide low impedance drive in both the positive and negative directions.

Another object of the instant invention is to provide for a logic inverter circuit having increased efficiency and decreased power consumption.

Still another object of the invention is to provide for a logic inverter circuit having faster rise and fall times than heretofore obtained with other circuits operating with comparable power.

A still further object of the invention is to provide for a single input point to facilitate coupling of logic elements.

The foregoing objects of the invention are attained by providing electrical circuitry connected to the collector of a semiconductor device, the circuitry having a large impedance when the semiconductor device is on and a low impedance in the opposite state. This is accomplished by utilizing a second semiconductor device as the load for the first by connecting the two devices in series and using a proper coupling between them. The two devices which are utilized are of a similar type, the same signal swing that will turn one on will turn the other off thereby providing for a logic inverter circuit.

In one modification of the invention, the first semiconductor device is paralleled with a second semiconductor device with an input signal to each. The two semiconductor devices in parallel are connected in series to a third semiconductor device using a proper coupling whereby the third semiconductor device acts as a load for the first two thus providing for a two-input NOR circuit.

In another modification of the invention, the first semiconductor device is connected in series with a second semiconductor device with an input to each. The two devices in series are connected in series to a third semiconductor device using a proper coupling whereby the third semiconductor device acts as a load for the first two providing a NAND logic inverter circuit.

Another modification of the invention is to couple together two logic inverter circuits to provide for a multivibrator.

Other objects and a fuller understanding of the invention may be had by referring to the following description and claims, taken in conjunction with the accompanying drawings, in which:

Figure 1:
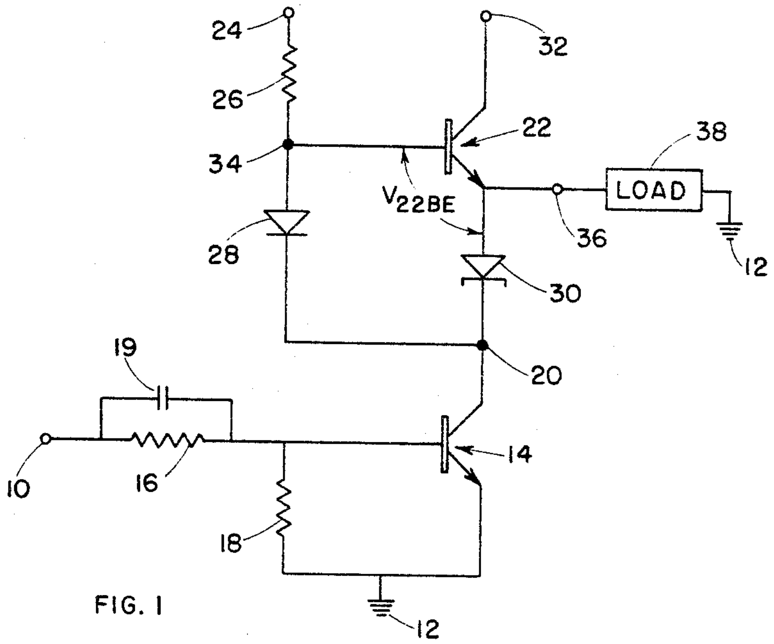
FIG. 1 is a circuit diagram of a basic logic inverter circuit invention.

Referring now to FIG. 1, there is shown an input 10 which is at ground potential 12. A first semiconductor device such as a transistor 14, for example, is connected to the input through a first resistor 16 to the base of transistor 14. A second resistor 18 is connected from the base of the transistor 14 to the ground potential 12. Connected parallel with respect to the resistor 16 is a speed-up capacitor 19. The emitter of transistor 14 is connected to the ground potential 12. The above which constitutes a circuit comprising input 10, resistor 16, resistor 18 and transistor 14 will be referred to hereinafter as the first stage.

A second stage circuit is connected to the first stage at the collector of the first transistor 14 through junction 20 and includes a transistor 22, a first voltage source 24 connected to the base of transistor 22 through a third resistor 26 which is interconnected between the voltage source 24 and the base of transistor 22. A conventional diode 28 and backward diode 30 are serially interconnected between the base and emitter of transistor 22, respectively. The base of transistor 22 is connected via junction 34 between resistor 26 and conventional diode 28. A second voltage source 32 is connected directly to the collector of transistor 22. The aforesaid circuit will be referred to hereinafter as the second stage.

In operation, transistor 14 is initially turned off except for leakage current, which can be neglected. Current from voltage source 24 flows through resistor 26 which is connected to the base of transistor 22. At junction 34, current flowing through resistor 26 from voltage source 24 feeds into the base of transistor 22 turning on the transistor 22. Voltage source 24 which is sufficiently larger than voltage source 32 as will be hereinafter explained, drives transistor 22 to saturation clamping output 36 to very nearly the potential of voltage source 32 providing a low output impedance.

Conventional diode 28 and backward diode 30 are connected in series opposition thereby creating an effective open circuit between the base and emitter of transistor 22. This condition will be referred to as the on-state. In the on-state condition there is no path to ground potential 12 other than provided by the load 38 which leads to 100% efficiency of current transfer to the load which normally would be the input to other logic elements.

To insure high efficiency, all of the current from voltage source 24 must flow into the base of transistor 22 in the on-state. This is accomplished, while proper coupling is maintained to the first stage, by connecting in series between the conventional diode 28 and the emitter of the transistor 22 through junction 20 a backward diode 30. To switch to the off-state, a positive voltage signal pulse is applied to input 10 coupled to the base of transistor 14 via resistor 16. Alternatively, resistor 16 may be by-passed by the speed-up capacitor 19. The aforesaid voltage pulse saturates transistor 14 and causes its collector to be charged to nearly ground potential 12. The negative going signal appearing in the collector of transistor 14 is coupled to the base of transistor 22 by conventional diode 28 which acts as a constant voltage drop coupling device. The proper choice of a conventional diode 28 provides for compensation of the voltage drop from base to emitter of transistor 22. By choosing conventional diode 28 and transistor 22 of the same material, temperature compensation is also provided for. The negative going signal appearing at the collector of transistor 14 cuts off transistor 22 and it ceases to supply current.

Simultaneous to the cut-off of transistor 22 by the turn-on of transistor 14, any charge stored in the capacitance of the load 38 connected to the emitter of transistor 22 through output 36 is quickly discharged to ground through backward diode 30. This speeds up the fall-time of the circuit. At the end of the input pulse, transistor 14 cuts off, allowing resistor 26 to pull the base of transistor 22 toward supply voltage 24. During the switching transient, transistor 22 acts as an emitter-follower providing a large current gain to the load 38. Transistor 22 saturates as aforementioned and one cycle is complete.

Output impedance of this circuit is always low. In the on-state, it is the impedance of a saturated transistor. In the off-state condition, it is that of a saturated transistor in series with a backward diode. The low impedance not only provides good rise and fall times, but also provides an output swing that is tightly clamped to fixed levels in both on- and off-states. Since the power efficiency of the circuit is high, it can deliver several times its standby power to the load. A further advantage is that the input is into a single transistor which allows a number of useful modifications.

The direct current output capabilities of this circuit are extremely good. Since two stages, each capable of current amplification, are cascaded, very little input current is necessary. Alternatively, transistors with low gains may be used or operation may be practical at lower currents at which forward current-transfer ratio is decreased.

The minimum collector supply voltage 32 that can be used in a particular application will be determined predominantly by the method of interstage coupling. Once the voltage 32 has been determined, it is then possible to select a value for voltage source 24. For minimum power dissipation for a given base current in the on-state, it has been found that voltage source 24 should be only slightly greater than the output voltage 36 plus the voltage across the base and emitter of transistor 22, which leads to a small value of resistance 26, which in turn causes a high dissipation when transistor 14 is turned on. These two conflicting requirements indicate that there must be an optimum voltage for voltage source 24. It has been discovered that this optimum voltage at voltage source 24 is equal to the voltage across the base and emitter of transistor 22, $V_{22}BE$, plus the output voltage, $V_{36}$, plus the square root of the product of ½ the output voltage, $V_{36}$, multiplied by the sum of the output voltage, $V_{36}$, and the voltage across the base and emitter of transistor 22, $V_{22}BE$, as indicated in the following equation:

$$V_{24}\text{ (optimum voltage)} = V_{22}BE + V_{36} + \sqrt{\tfrac{1}{2}V_{36}(V_{36}+V_{22}BE)}$$

The following table shows by way of example particular values for the various components for the circuit of FIG. 1 which have been operated successfully. These values are set forth by way of example only, and the invention is not limited to them.

*Table I*

| | |
|---|---|
| Resistor **16** | 100K. |
| Resistor **18** | 1M. |
| Capacitor **19** | 33 pf. |
| Voltage source **24** | 2.2 v. |
| Resistor **26** | 100K. |
| Diode **28** | *1N457. |
| Backward diode **30** | *HU–5. |
| Voltage source **32** | 1.2 v. |
| Capacitance of load **38** | 250 pf. |
| Resistance of load **38** | 33K. |

* Commercial designation.

The basic transistor inverter circuit described hereinabove is extremely versatile and can be readily modified to provide a large number of useful logic circuits, principally because of the simple coupling arrangement into a single transistor.

Figure 2:
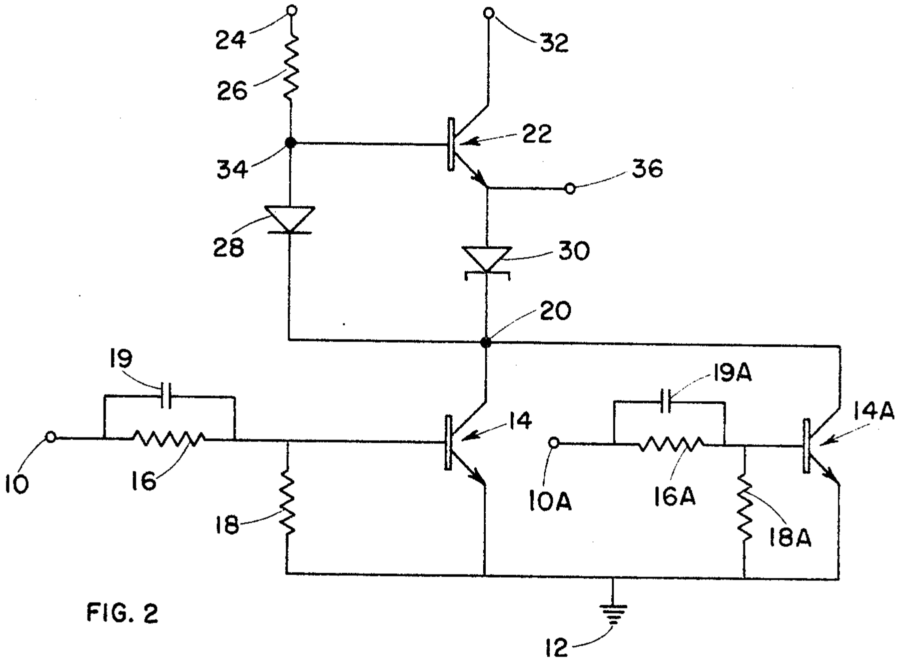
FIG. 2 is a circuit diagram modification of the circuit of FIG. 1 providing for two-input NOR circuit.

One such modification of the basic circuitry described with respect to FIG. 1 is presented in FIG. 2 wherein first stages as described for FIG. 1 are connected in parallel thereby providing for a two-input NOR circuit. Operation of this modified inverter circuit is the same as for the transistor logic inverter circuit described for FIG. 1. More particularly, paralleling the lower transistor 14 with a similar second transistor 14A provides a two-input 10 and 10A, NOR circuit. The capacitors 19 and 19A, the resistors 16 and 16A, the resistors 18 and 18A, and the transistors 14, 14A and 22 may be of the same types, respectively. The transistors do not have to have the same electrical characteristics even though similar. The two parallel transistors 14 and 14A of the first stage are connected together to the upper stage at junction 20 via the collectors of transistors 14 and 14A.

The emitters of transistors 14 and 14A and the resistors 18 and 18A are returned to ground as in the basic circuit of FIG. 1. The lower stages in parallel function in the same manner as previously described for the first stage of FIG. 1 whereby a positive voltage pulse is applied either to inputs 10 or 10A which are coupled to the bases of transistors 14 and 14A, respectively, via resistors 16 and 16A, respectively. Alternatively, resistors 16 and 16A may be by-passed by speed-up capacitors 19 and 19A, respectively. The aforesaid voltage pulse saturates transistors 14 or 14A and clamps their collectors to nearly ground potential 12. Isolation between said inputs 10 and 10A is provided by transistors 14 and 14A themselves, so that no diode or other special devices need be utilized for coupling. In some instances no base-to-ground shunting resistor is required making possible coupling with a single resistor and speed-up capacitor.

Without a diode in the coupling circuit, both the rise and the fall of the driving source to the inputs 10 and 10A are coupled directly to the bases of the input transistors 14 and 14A, respectively. Full current is transferred to the upper stage by this arrangement. As mentioned hereinabove this modification provides for a two-input NOR circuit and can be used to implement all logic functions. Any number of paralleled stages can be so connected.

Figure 3:
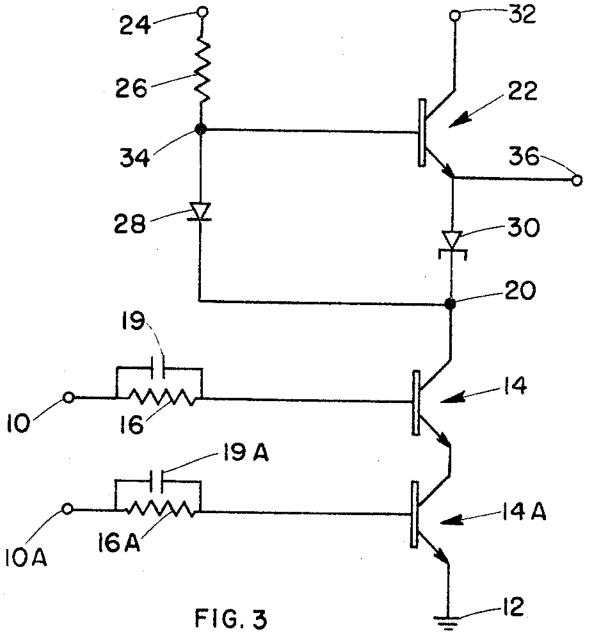
FIG. 3 is a circuit diagram modification of the circuit of FIG. 1 providing for a NAND logic inverter circuit.

Referring now to FIG. 3, there is shown a second universal logic element termed a NAND, which consists of an AND gate and an inverter attached thereto. By using two transistors 14 and 14A in series, the transistors being similar, that is NPN or PNP, with inputs 10 and 10A connected to the bases of said transistors 14 and 14A, respectively, each through resistors 16 and 16A, and capacitors 19 and 19A, respectively, as the first stage of a transistor logic inverter circuit and connecting the first stage to the second stage described for FIG. 1 at junction 20 through the collector of transistor 14, a two-input NAND transistor logic inverter circuit is obtained. In order to maintain the output voltage 36 at ground potential 12 in the off-state condition, compensation must be provided for the additional collector-emitter saturation voltage of the transistor 14A. Selection of a conventional diode 28 with a lower forward drop for coupling to the base of transistor 22 provides this compensation. An extension of the aforesaid circuit to three or more inputs would require a selection of transistors for low collector-emitter voltage of the transistors and a very low forward-drop diode 28.

Figure 4:
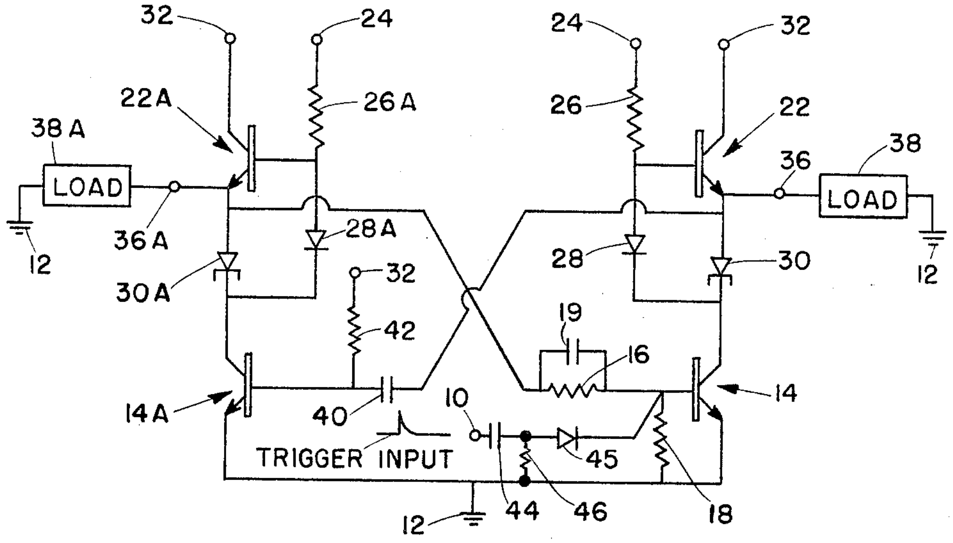
FIG. 4 is a circuit diagram whereby two of the circuits of FIG. 1 are embodied in combination to form a multivibrator.

Referring now to FIG. 4, two inverter circuits as described with reference to FIG. 1 can be coupled together to form a monostable multivibrator. The multivibrator is a combination of two inverter circuits of FIG. 1 having two sets of similar transistors in series, 14 and 22, and 14A and 22A, with outputs 36 and 36A disposed between the emitters of transistors 22 and 22A and equal loads 38 and 38A, respectively, and two coupling devices including conventional diodes 28 and 28A and backward diodes 30 and 30A serially connected to the emitters of transistors 22 and 22A, respectively. The aforementioned transistors and coupling devices being connected to voltage source 24 through resistors 26 and 26A, respectively, and voltage source 32 connected to the collectors of transistors 22 and 22A, respectively, functioning as heretofore described for FIG. 1. The aforesaid inverter circuits are coupled by the utilization of a timing capacitor 40 connected between the emitter of transistor 22 and the base of transistor 14A and a resistor 42 interconnected between supply voltage 32 and the base of transistor 14A. Coupling on the opposite side is provide for by the output 36A to the base of transistor 14 through resistor 16 paralleled with a speed-up capacitor 19, the base of transistor 14 being shunted by resistor 18. The triggering circuit for the monostable multivibrator accepts a positive trigger input 10 coupled by a capacitor 44 and diode 45 to the base of transistor 14. The function of capacitor 44 is to provide D.C. isolation and to help differentiate the signal in conjunction with resistor 46 if this function is necessary. The resistor 46 is connected between junction of capacitor 10 and diode 45 to ground potential 12. Diode 45 insures that only a pulse of the correct polarity to trigger the multivibrator will be applied to the base of transistor 14.

The time constant of the circuit and therefore the length of the output pulse are determined by resistor 42 and capacitor 40. Capacitor 40 is charged toward supply voltage 32 through resistor 42. Before application of an input pulse, transistor 14 is cut off and output voltage 36 is clamped to voltage source 32 through transistor 22 which is saturated. When the positive triggering pulse is coupled into transistor 14, it saturates and the output 36 is clamped to ground potential 12. This transmits a negative going pulse through capacitor 40 to the base of transistor 14A which cuts it off allowing output 36A to be clamped to voltage source 32. Current now flowing through resistor 42 from voltage source 32 charges capacitor 40 and raises the base voltage of transistor 14A such that when the voltage appearing at the base of transistor 14A reaches a sufficiently positive potential to turn transistor 14A on, the multivibrator will regeneratively change states and the side that was previously on will be cut off and vice versa.

The circuits described herein are not limited to low power operation but can be used for any power level desired. Further, variations of the circuits compromising the invention can be undertaken by one skilled in the art to construct circuits that are, for example, astable and bistable, and to provide gating functions of the NAND and NOR form utilizing either diode or transistor logic gating at the input such as an AND or an OR network utilizing the transistors or diodes. It is the intention, therefore, to be limited only as indicated by the scope of the following claims.

What is claimed is:

1. A transistor logic inverter circuit consisting of a first stage, said first stage including a first transistor having a collector, a base, and an emitter, said emitter being connected to ground, a first resistor serially connected to said base between an input signal and said base, a capacitor connected parallel to said first resistor, and a second resistor interconnected between ground and said base of said first transistor, and a second stage, said second stage including a second transistor having a collector, a base, and an emitter, a backward diode for connecting the emitter of said second transistor to the collector of said first transistor, a first voltage source impressed on said collector of said second transistor, a second voltage source impressed on base of said second transistor through a first junction, said second voltage source having potential greater than that of said first voltage source, a third resistor interconnected between said second voltage source and said first junction, and a diode interconnected between said first junction and said first transistor collector through a second junction connected to said first transistor collector and said backward diode, the resistance of said backward diode being negligible in the backward direction from the emitter of said second transistor to said second junction whereby the capacitance of a load connected to said second transistor emitter is discharged upon actuation of said first stage, the voltage drop across said backward diode in the opposite direction being quite high so that the resistance in the reverse direction across said diode in series with said backward diode is greater than the base emitter voltage of said second transistor to provide an effective open circuit upon actuation of said second stage.

2. A transistor logic inverter circuit comprising
- a first transistor having a collector, base, and an emitter connected to ground,
- a resistor connected to an input signal and base of said first transistor,
- a capacitor connected in parallel with said resistor to the input signal and the base of said first transistor,
- a second transistor having a collector, a base, and an emitter connected to a load,
- a backward diode connected to the emitter of the second transistor and the collector of the first transistor, said backward diode having a very low resistance to positive current flow from said second transistor to said first transistor and a low voltage drop whereby the capacitance of the load is readily discharged to ground through said first transistor when said first transistor is activated by the input signal,
- a first voltage source impressed on the collector of said second transistor,
- a second voltage source impressed on the base of said second transistor, said second voltage source having a potential greater than that of said first voltage source,
- a resistor connected to said second voltage source and the base of said second transistor through a first junction, and
- a diode interconnected between said first junction and the collector of said first transistor through a second junction between said backward diode and the collector of said first transistor whereby said diode and said backward diode are serially connected between the base and emitter of said second transistor to provide an effective open circuit therebetween upon actuation of said second transistor by said second voltage source.

References Cited by the Examiner

UNITED STATES PATENTS

| | | | |
|---|---|---|---|
| 2,874,315 | 2/1959 | Reichert | 307—88.5 |
| 2,976,432 | 3/1961 | Geckle | 307—88.5 |
| 3,050,637 | 4/1962 | Kaufman | 307—88.5 |
| 3,124,758 | 3/1964 | Bellamy et al. | 330—24 |

OTHER REFERENCES

"Digital Computer Components and Circuits," by Richards, D. Van Nostrand & Co., New York, January 1960, pp. 70 and 71.

ARTHUR GAUSS, *Primary Examiner.*

B. P. DAVIS, *Assistant Examiner.*